United States Patent [19]

Baker

[11] Patent Number: 4,520,276
[45] Date of Patent: May 28, 1985

[54] ZERO-DELAY RAMP GENERATOR
[75] Inventor: Jay S. Baker, San Carlos, Calif.
[73] Assignee: Ampex Corporation, Redwood City, Calif.
[21] Appl. No.: 418,901
[22] Filed: Sep. 16, 1982
[51] Int. Cl.$^3$ .......................... H03K 4/08; G06G 7/18
[52] U.S. Cl. .................................... 307/228; 307/494; 328/127; 328/181
[58] Field of Search ............... 307/228, 494; 328/127, 328/128, 181

[56] References Cited
U.S. PATENT DOCUMENTS
3,633,043 1/1972 Antholly .......................... 307/228
3,986,127 10/1976 Ray .................................. 328/128
4,377,759 3/1983 Ohhata et al. ................... 328/128

Primary Examiner—Stanley D. Miller
Assistant Examiner—B. P. Davis
Attorney, Agent, or Firm—George B. Almeida; Joel D. Talcott

[57] ABSTRACT

An error amplifier receives an on/off signal and supplies an error signal to an integrator. The latter provides a ramp output, which is fed back to the error amplifier whereby the error signal therefrom further is dependent upon the ramp output. The error signal is selectively clamped positively and negatively whereby the resulting ramp output has a constant ramp time, with no ramp on/off delay.

12 Claims, 4 Drawing Figures

U.S. Patent    May 28, 1985    4,520,276
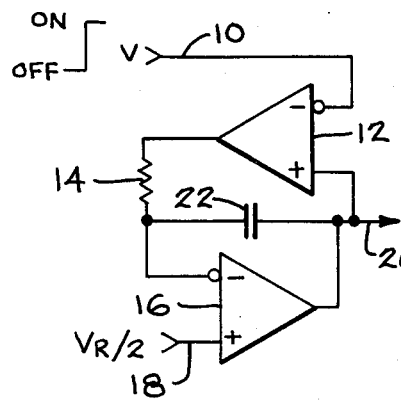
FIG_2
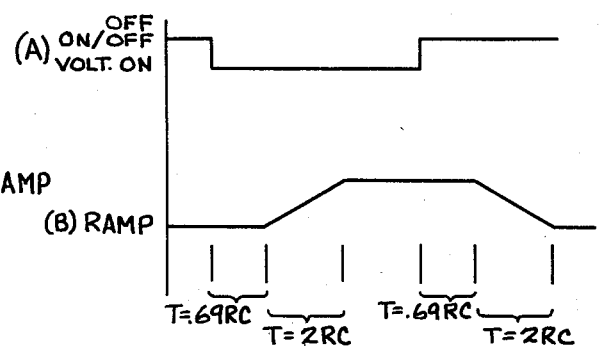
FIG_1 PRIOR ART
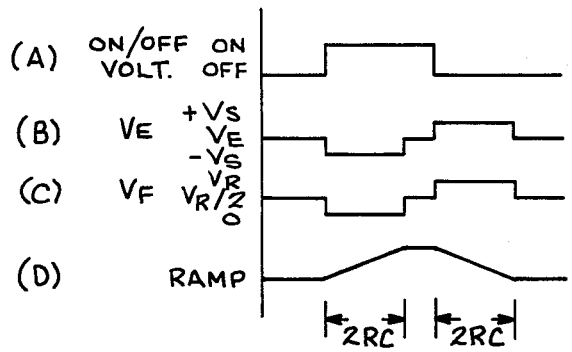
FIG_4
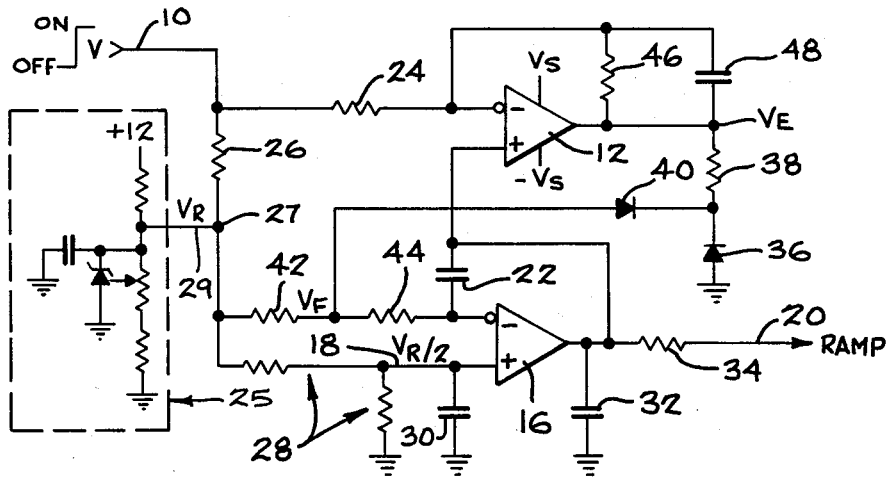
FIG_3

ZERO-DELAY RAMP GENERATOR

BACKGROUND AND SUMMARY OF THE INVENTION

The invention relates to a ramp generator with no ramp on/off delay, which is supply voltage and temperature independent and which is controllable by a D.C. voltage.

In the course of providing analog recordings such as, for example, in the professional video recording field, it is necessary to perform editing operations, particularly in the generation of professional video broadcast tapes. The editing process in turn requires the generation of a very precise linear ramp of constant ramp time in order to provide pop-free edits. That is, as commonly known, when a high frequency signal is fed to an inductor such as that of a magnetic record or erase head, it tends to cause an audible and very annoying click or pop which is recorded on tape. Ramping the bias current suppresses the unacceptable pop.

Typical analog recording systems such as those, for example, in a helical video recorder, presently utilize a basic integrator circuit i.e. an operational amplifier, to generate an adequate linear ramp waveform. However, after the integrator circuit has completed the generation of either an increasing or decreasing ramp, the input of the operational amplifier tends to drift towards the full supply voltage fed thereto. Thus when the integrator circuit is turned on again, there is a significant delay while the input to the operational amplifier is charging back to its operating point, before the ramp is actually started. Thus, the start of the ramp is significantly delayed relative to the time that a "go" input signal is applied to the generator. In addition, the ramp time is dependent upon variations in the supply voltage and upon temperature. Such conditions deteriorate the precision of the generated ramp, leading to ramp timing variations and the resulting popping sounds at the edit points.

In a modification to the typical integrator ramp generator of mention above, the delay generated after the application of the "go" signal may be shortened by diode clamping the input to the operational amplifier via back-to-back diodes. However, the shortened delay time still is dependent upon a 0.6 V supply term, wherein V supply is a variable.

The present invention overcomes the shortcomings of the present typical ramp generators mentioned above, by providing a ramp generator with no ramp timing delay, wherein the ramp is a function of an operational amplifier RC term only, and is not dependent upon supply voltage or temperature variations. In addition, the bias level fed to the head is readily controlable via a DC level.

To this end, an integrator for generating the ramp output signal is preceeded by an error amplifier. The latter is supplied with the ramp-on signal and, in turn, supplies an input signal to an integrator. The integrator also is supplied with a reference voltage. The output of the integrator is fed back to the positive input of the error amplifier. The input signal is clamped positively by the reference voltage and negatively by ground. The result is the generation of a ramp with no delay from the time the ramp-on signal is applied, wherein the ramp is a function of the RC term of the integrator only.

Accordingly, it is an object of the invention to provide a precise ramp time with no ramp timing delay when the ramp is turned on or off.

It is another object to provide a ramp which is uneffected by supply voltage and temperature variations.

Another object is to provide a ramp wherein the bias or erase level is readily controlled by a DC voltage level while constant ramp times are maintained for editing.

BRIEF DESCRIPTION OF THE DRAWINGS

FIGS. 1A–1B is a graph illustrating the timing conditions experienced by prior art ramp generators.

FIG. 2 is a simplified schematic of an embodiment of the invention.

FIG. 3 is a schematic of a modified embodiment of the circuit of FIG. 2.

FIGS. 4A–4D is a graph illustrating the timing conditions of the ramp generator of FIGS. 2 and 3.

DESCRIPTION OF THE PREFERRED EMBODIMENTS

FIG. 1A depicts the waveform of a ramp on/off logic signal, wherein a high state is "off" and a low state is "on". FIG. 1B depicts the resulting ramp waveform generated by present typical ramp generators, wherein there is a ramp timing delay of the order of 0.69 RC before the ramp starts after the ramp-on signal is applied, wherein RC is the time constant of the ramp generator. Likewise, when the ramp-off signal is applied, there is a delay of 0.69 RC before the ramp begins to decrease.

FIG. 2 depicts an embodiment of the present ramp generator, wherein a ramp on/off logic signal V is applied to an input 10 and thence to the negative input of an operational amplifier, i.e., an error amplifier 12. The latter compares the output ramp with an input signal $V_R$ as further described below. The output of the error amplifier 12 is coupled via an integrating resistor 14 to the negative input of an operational amplifier configured as an integrator 16. The positive input of the latter is coupled to one-half of a reference voltage, $V_R$ via line 18. The integrator 16 supplies a resulting ramp on an output 20, which output is also fed back to the positive input of the error amplifier 12, as well as to the negative input of operational amplifier 16 via a capacitor 22. Thus operational amplifier 16 is configured as the integrator of previous mention, while operational amplifier 12 is configured as a differential amplifier, i.e., the error amplifier. In the embodiment of FIG. 2 the operational amplifier 12 may be an LM324 such as manufactured by Signetics Corporation. In such circuit, the minus supply voltage may be ground and the positive supply voltage may be the reference voltage $V_R$, the latter being the upper ramp voltage level.

FIG. 3 depicts a further embodiment of FIG. 2, wherein like components are similarly numbered. Thus the ramp on/off signal V is fed from input 10 through a resistor 24 to the inverting input of the error amplifier 12. Input 10 also is coupled to a junction 27 via a resistor 26. A reference voltage $V_R$ generated via a reference voltage generator 25 is coupled to the junction 27 via a line 29, and thence as the $V_R/2$ input line 18 to the positive input of the integrator 16 via a voltage divider 28. A capacitor 30 provides high frequency de-coupling. The output of the integrator 16 is coupled to ground via a capacitor 32, which lowers the output impedance of the integrator at high frequencies to smooth the bias ripple voltage. The integrator 16 output also is fed back to the non-inverting input of the error amplifier 12. Capacitor 22 is the integrating capacitor. The ramp output waveform is provided on the output 20 via a resistor 34.

The signal $V_E$ from amplifier 12 is negatively clamped to ground by a diode 36 via a resistor 38, and is positively clamped by signal $V_E$ by means of a diode 40. An integrating resistor 44 couples the amplifier 12 output to the inverting input of the operational amplifier 16.

A resistor and capacitor 46,48 couple the output back to the inverting input of the operational amplifier 12 to provide roll off at high frequencies.

In operation, referring also to FIGS. 4A-4D, the ramp on/off signal V on input 10 may be the erase logic level from the recoder system, which turns the ramp generator circuit on and off. When V is low (FIG. 4A), the circuit is off and the ramp output is zero (FIG. 4D). The voltage $V_E$ at the output of the error amplifier 12 is zero (FIG. 4B), and the voltage $V_F$ is equal to the reference voltage $V_R/2$ (FIG. 4C).

To turn the ramp on, the erase logic V goes high (FIG. 4A) to provide an open collector condition on input 10. The inverting input of the error amplifier 12 goes to $V_R$. The output of the error amplifier $V_E$ goes to the negative supply voltage $-V_S$ (FIG. 4B). The voltage $V_F$ is clamped to ground via the diodes 40, 36 (FIG. 4C) which creates a $V_R/2$ current condition across the integrating resistor 44 to cause the ramp to start ramping up. Once the ramp reaches the reference voltage $V_R$, then both the inverting and non-inverting inputs of the error amplifier 12 are at $V_R$. Therefore, $V_F$ goes to $V_R/2$ (FIG. 4C) to stabilize the integrator 16 at the upper ramp level (FIG. 4D). The error amplifier output $V_E$ is at a voltage which is one diode drop below $V_F$, as required to bias the circuit.

When the ramp is ramped down, the logic voltage V goes low, the input 10 is pulled to ground, and the inverting input of the error amplifier 12 goes to ground. The output $V_E$ thereof goes to the positive supply voltage $+V_S$ (FIG. 4B). The diodes 40, 36 are turned off. Resistor 42 is many, many times less than resistor 44, so therefore the voltage $V_F$ is equal to the reference voltage $V_R$ on line 29 (FIG. 4C). Thus voltage $V_R/2$ appears across the integrating resistor 44 and the ramp decreases to zero (FIG. 4D). The circuit again is back to the stable state.

Since the ramp is always ramping $V_R$ volts, then $(2RC/V_R)(V_R)$ volts-seconds/volts = $2RC$ seconds, is always the ramp time. Ergo, the ramp has no timing delay and is a function of the RC term only.

As previously mentioned, the upper voltage level of the ramp corresponding to the reference voltage $V_R$ is readily controlled via a DC level; ie, the level established via the reference voltage generator 25. If $V_R$ is decreased, the upper ramp level is similarly decreased, and vice versa. Further, in practice, the DC ramp is generated and the output of the ramp is switched between the upper ramp voltage and ground at a selected bias frequency. The result is a bias frequency squarewave driving voltage whose amplitude equals the upper ramp voltage.

What is claimed is:
1. A circuit for generating a ramp output comprising: means for supplying a ramp on/off signal; error amplifier means receiving the ramp on/off signal for initiating and stabilizing the ramp output;
integrator means for generating ramp output coupled at its inverting input to the error amplifier means output, and at its ramp output back to the error amplifier means input; and
reference voltage means coupled to the non-inverting input of the integrator means for determining the extent of the ramp output independently of the ramp on/off signal.

2. The circuit of claim 1 including:
supply voltage means coupled to the error amplifier means for swinging the output of the latter across the supply voltage in response to the ramp on/off siganl.

3. The circuit of claim 1 wherein:
the error amplifier means is a differential amplifier whose inverting input is coupled to the means for supplying the ramp on/off signal; and
the integrator means is an operational amplifier.

4. The circuit of claim 1 further including:
a ground;
an integrating resistor coupled to the inverting input of the integrating means; and
clamping means for clamping the integrating resistor positively via the reference voltage means and negatively via the ground.

5. The circuit of claim 1 wherein the reference voltage means include:
adjusting means for varying the DC level of the output thereof to similarly adjust the ramp output independently of the ramp on/off signal.

6. The circuit of claim 5 including:
a voltage divider coupled from the reference voltage means to the non-inverting input of the integrator means.

7. A circuit for generating a ramp output in response to an on/off logic level, comprising:
first operational amplifier means for generating an error signal in response to the on/off logic level;
reference voltage generator means for generating a variable DC reference voltage;
second operational amplifier means for receiving and integrating the error signal and for generating the ramp output in response to the variable DC reference voltage; and
said error signal further being dependent upon the ramp output from the second operational amplifier means.

8. The circuit of claim 7 wherein the first operational amplifier means include:
inverting and non-inverting inputs;
said inverting input being responsive to the on/off logic level; and
said non-inverting input being coupled to the ramp output of the second operational amplifier means.

9. The circuit of claim 7 wherein the second operational amplifier means include:
inverting and non-inverting inputs; and
inverting input being responsive to the error signal from the first operational amplifier means; and
said non-inverting input being operatively coupled to receive a portion of the DC reference voltage equal to the extent of the ramp output.

10. The circuit of claim 7 further including:
a supply voltage source coupled to the first operational amplifier means;

said first operational amplifier means further being responsive to the reference voltage generator means and to the on/off logic level to swing the error signal over the range of the supply voltage source.

11. The circuit of claim 9 further including:

a ground;

clamping means for clamping the error signal fed to the inverting input of the second operational amplifier means positively via the reference voltage generator means and negatively via the ground.

12. A circuit for generating a ramp output comprising:

on/off signal source means;

operational amplifier means for generating an error signal and having an inverting input coupled to the on/off signal source means, and having a non-inverting input;

reference signal generating means;

integrator means for generating the ramp output and having inverting and non-inverting inputs operatively coupled to the reference signal generating means, said inverting input further being operatively coupled to the error signal from the operational amplifier means;

said integrator means having its ramp output coupled to the non-inverting input of the operational amplifier means; and clamping means coupled to the operational amplifier means for clamping the error signal fed to the inverting input of the integrator means to selected voltage levels commensurate with the ramp output.

* * * * *

UNITED STATES PATENT AND TRADEMARK OFFICE
CERTIFICATE OF CORRECTION

PATENT NO. : 4,520,276

DATED : May 28, 1985

INVENTOR(S) : Jay S. Baker

It is certified that error appears in the above-identified patent and that said Letters Patent is hereby corrected as shown below:

Column 3, line 8, change "$V_E$" to --$V_F$--.

Signed and Sealed this

Twenty-ninth Day of October 1985

[SEAL]

Attest:

DONALD J. QUIGG

Attesting Officer

Commissioner of Patents and
Trademarks—Designate